United States Patent
Hsu et al.

(10) Patent No.: US 12,245,519 B2
(45) Date of Patent: Mar. 4, 2025

(54) SEMICONDUCTOR MEMORY DEVICE AND FABRICATION METHOD THEREOF

(71) Applicant: UNITED MICROELECTRONICS CORP., Hsin-Chu (TW)

(72) Inventors: Chia-Chang Hsu, Kaohsiung (TW); Tang-Chun Weng, Chiayi (TW); Cheng-Yi Lin, Yilan County (TW); Yung-Shen Chen, Kaohsiung (TW); Chia-Hung Lin, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 18/542,791

(22) Filed: Dec. 18, 2023

(65) Prior Publication Data
US 2024/0122078 A1   Apr. 11, 2024

Related U.S. Application Data

(62) Division of application No. 17/319,106, filed on May 13, 2021, now Pat. No. 11,895,927.

(30) Foreign Application Priority Data

Apr. 25, 2021 (CN) .......................... 202110446979.5

(51) Int. Cl.
*H10N 50/80* (2023.01)
*H10B 61/00* (2023.01)
*H10N 50/01* (2023.01)

(52) U.S. Cl.
CPC ............. *H10N 50/80* (2023.02); *H10B 61/00* (2023.02); *H10N 50/01* (2023.02)

(58) Field of Classification Search
None
See application file for complete search history.

(56) References Cited

U.S. PATENT DOCUMENTS

| 10,177,311 B1 | 1/2019 | Hsieh | |
| 2013/0015540 A1* | 1/2013 | Choi | H10N 50/01 257/E43.001 |
| 2017/0084822 A1* | 3/2017 | Kim | H10N 50/85 |
| 2019/0088864 A1* | 3/2019 | Cho | H10B 61/20 |

* cited by examiner

*Primary Examiner* — Evren Seven
*Assistant Examiner* — Cole Leon Lindsey
(74) *Attorney, Agent, or Firm* — Winston Hsu

(57) ABSTRACT

A semiconductor memory device includes a substrate having a conductor region thereon, an interlayer dielectric layer on the substrate, and a conductive via electrically connected to the conductor region. The conductive via has a lower portion embedded in the interlayer dielectric layer and an upper portion protruding from a top surface of the interlayer dielectric layer. The upper portion has a rounded top surface. A storage structure conformally covers the rounded top surface.

5 Claims, 5 Drawing Sheets

SEMICONDUCTOR MEMORY DEVICE AND FABRICATION METHOD THEREOF

CROSS REFERENCE TO RELATED APPLICATIONS

This application is a division of U.S. application Ser. No. 17/319,106, filed on May 13, 2021. The content of the application is incorporated herein by reference.

BACKGROUND OF THE INVENTION

1. Field of the Invention

The present invention relates to the field of semiconductor technology, in particular to a semiconductor memory device and a fabrication method thereof.

2. Description of the Prior Art

Magnetic Random Access Memory (MRAM) is a non-volatile semiconductor memory that can keep the stored data intact even after the power is turned off. In terms of performance, MRAM has the high-speed read and write capabilities of static random access memory (SRAM), and the high integration of dynamic random access memory (DRAM), and it can basically be written repeatedly indefinitely. It is a "full-featured" solid state memory. Therefore, MRAM is expected to dominate the next-generation memory market.

MRAM generally includes peripheral circuits and multiple magnetic storage units. The magnetic storage unit is usually composed of a transistor and a magnetic tunnel junction (MTJ) element. Moreover, the MTJ element is located between two metal layers of the CMOS integrated circuit, for example inserted between the second metal layer and the third metal layer, and the two metal layers are connected through metal vias.

However, the size of the MTJ element is limited by the shadowing effect of the ion beam etching angle and cannot be increased, resulting in limited tunneling magnetoresistance (TMR).

SUMMARY OF THE INVENTION

It is one object of the present invention to provide a semiconductor memory device and a manufacturing method thereof to solve the above-mentioned shortcomings or deficiencies of the prior art.

According to one aspect of the invention, a semiconductor memory device includes a substrate comprising a conductor region thereon; an interlayer dielectric layer on the substrate; and a conductive via electrically connected to the conductor region. The conductive via comprises a lower portion embedded in the interlayer dielectric layer and an upper portion protruding from a top surface of the interlayer dielectric layer. The upper portion has a rounded top surface. A storage structure conformally covers the rounded top surface.

According to some embodiments, a thickness of the lower portion is greater than that of the upper portion.

According to some embodiments, the interlayer dielectric layer is a tetraethoxysilane (TEOS)-based silicon oxide layer.

According to some embodiments, the semiconductor memory device further includes an etch stop layer between the interlayer dielectric layer and the substrate.

According to some embodiments, the storage structure comprises a magnetic tunnel junction stack.

According to some embodiments, the conductive via comprises a tungsten layer.

According to some embodiments, the conductive via comprises a barrier layer between the tungsten layer and the interlayer dielectric layer.

According to another aspect of the invention, a semiconductor memory device includes a substrate comprising a conductor region thereon; an interlayer dielectric layer on the substrate; and a conductive via electrically connected to the conductor region. The conductive via comprises a lower portion embedded in the interlayer dielectric layer and an upper portion protruding from a top surface of the interlayer dielectric layer. The upper portion has a flat top surface and a round edge surface extending between the flat top surface and a sidewall surface of the upper portion. A storage structure conformally covers the rounded top surface.

According to some embodiments, a thickness of the lower portion is greater than that of the upper portion.

According to some embodiments, the interlayer dielectric layer is a TEOS-based silicon oxide layer.

According to some embodiments, the semiconductor memory device further includes an etch stop layer between the interlayer dielectric layer and the substrate.

According to some embodiments, the storage structure comprises a magnetic tunnel junction stack.

According to some embodiments, the conductive via comprises a tungsten layer.

According to some embodiments, the conductive via comprises a barrier layer between the tungsten layer and the interlayer dielectric layer.

According to still another aspect of the invention, a method of forming a semiconductor memory device is provided. A substrate comprising a conductor region thereon is provided. An interlayer dielectric layer is formed on the substrate. A conductive via is formed in the interlayer dielectric layer. The conductive via is electrically connected to the conductor region. The interlayer dielectric layer is subjected to a first etching process, thereby forming an upper portion of the conductive via protruding from a top surface of the interlayer dielectric layer and a lower portion of the conductive via embedded in the interlayer dielectric layer. The upper portion of the conductive via is then subjected to a second etching process to trim the upper portion. A storage structure is formed to conformally cover the upper portion of the conductive via.

According to some embodiments, a thickness of the lower portion is greater than that of the upper portion.

According to some embodiments, the interlayer dielectric layer is a TEOS-based silicon oxide layer.

According to some embodiments, the method further includes: forming an etch stop layer between the interlayer dielectric layer and the substrate.

According to some embodiments, the upper portion has a rounded top surface, after subjecting the upper portion of the conductive via to the second etching process.

According to some embodiments, the upper portion has a flat top surface and a rounded edge surface extending between the flat top surface and a sidewall surface of the upper portion, after subjecting the upper portion of the conductive via to the second etching process.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention.

Other embodiments may be utilized and structural, logical, and electrical changes may be made without departing from the scope of the present invention. Therefore, the following detailed description is not to be considered as limiting, but the embodiments included herein are defined by the scope of the accompanying claims.

Figure 1:
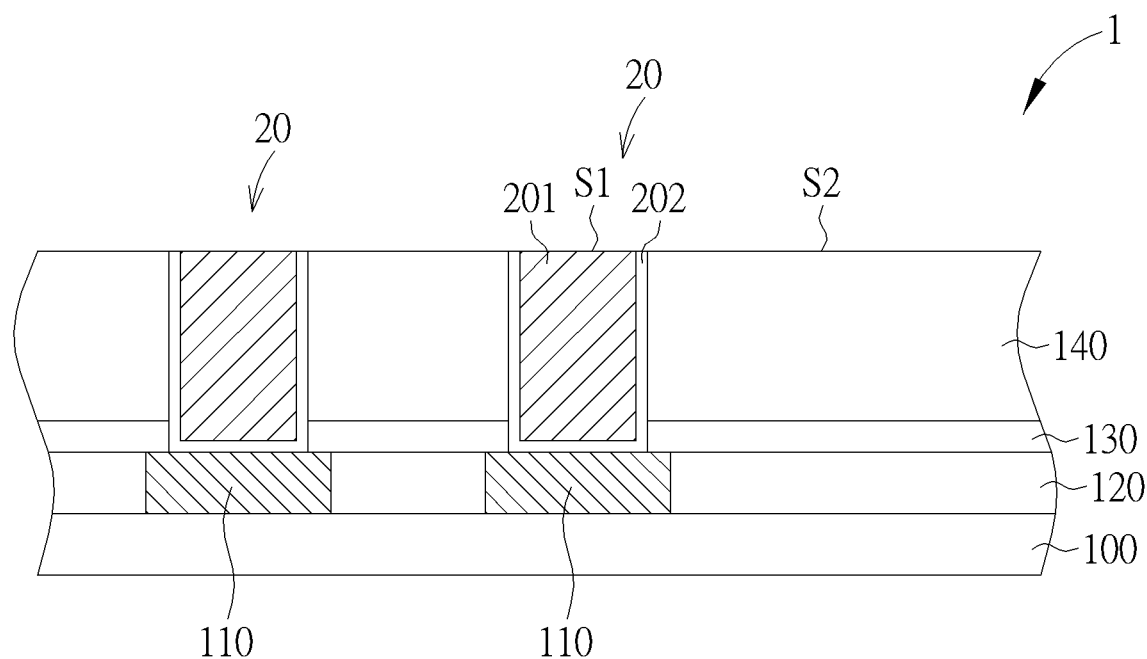
FIG. 1 to FIG. 5 are schematic diagrams illustrating a method of forming a semiconductor memory device according to an embodiment of the present invention.

FIG. 1 to FIG. 5 are schematic diagrams illustrating a method of forming a semiconductor memory device 1 according to an embodiment of the present invention. As shown in FIG. 1, first, a substrate 100, such as a silicon substrate, is provided, on which a conductor region 110 is provided. For example, the conductor region 110 may be a copper metal layer disposed in a dielectric layer 120, but is not limited thereto. According to an embodiment of the present invention, the dielectric layer 120 may be a low dielectric constant material layer, for example, the dielectric constant may be less than 2.5, but is not limited thereto. An inter-layer dielectric layer 140 is formed on the substrate 100. According to an embodiment of the present invention, the interlayer dielectric layer 140 may be a tetraethylorthosilicate (TEOS)-based silicon oxide layer.

According to the embodiment of the present invention, an etch stop layer 130 may be formed between the interlayer dielectric layer 140 and the substrate 100, for example, a nitrogen-doped silicon carbide layer, but it is not limited thereto.

According to the embodiment of the present invention, then, a conductive via 20 is formed in the interlayer dielectric layer 140. According to the embodiment of the present invention, the conductive via 20 is electrically connected to the conductor region 110. At this point, the top surface S1 of the conductive via 20 and the top surface S2 of the interlayer dielectric layer 140 are coplanar. According to the embodiment of the present invention, the conductive via 20 may include a tungsten metal layer 201. In addition, the conductive via 20 may have a barrier layer 202 between the tungsten metal layer 201 and the interlayer dielectric layer 140, such as titanium nitride, but is not limited thereto.

The method of forming the conductive via 20 may include a lithography process, an etching process, a chemical vapor deposition (CVD) process, a chemical mechanical polishing (CMP) process, and the like.

Figure 2:
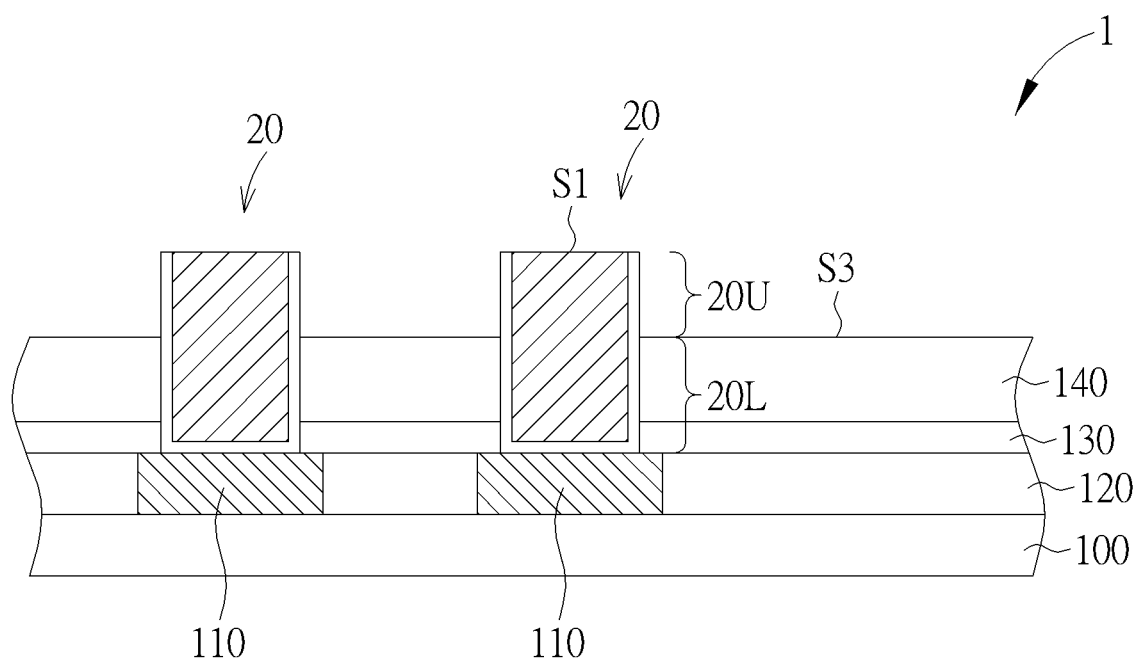

As shown in FIG. 2, a first etching process, such as a dry etching process, is then performed on the interlayer dielectric layer 140 to remove a part of the interlayer dielectric layer 140, so that an upper portion 20U of the conductive via 20 protrudes from the top surface S3 of the interlayer dielectric layer 140 and the lower portion 20L of the conductive via 20 is still embedded in the interlayer dielectric layer 140.

Figure 3:
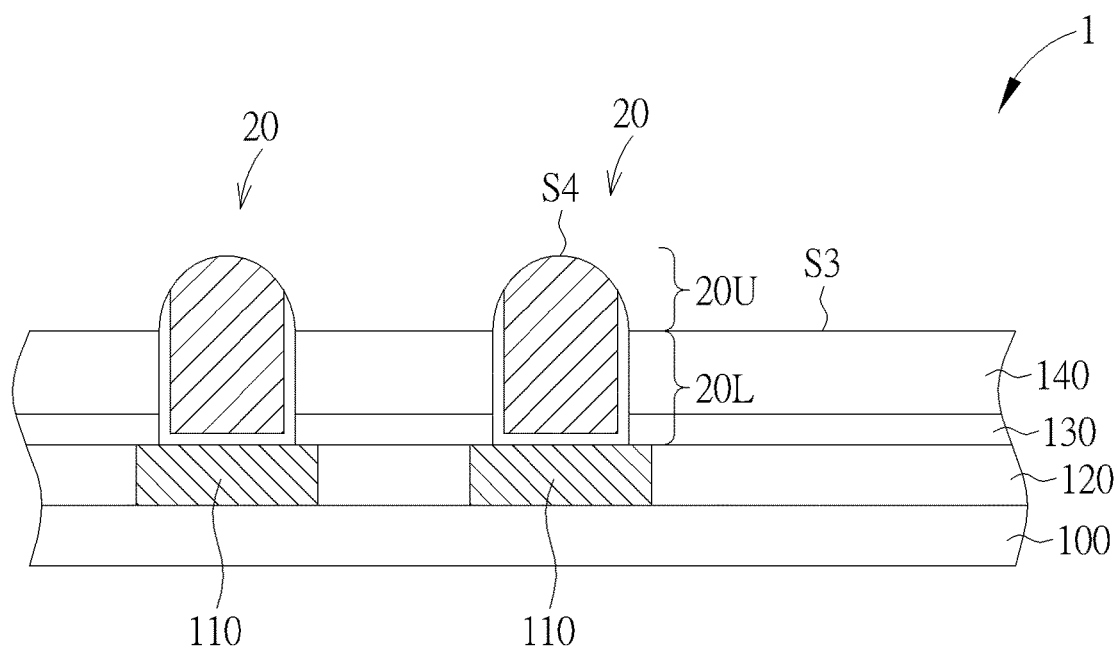

As shown in FIG. 3, next, a second etching process, such as a dry etching process, is performed on the upper portion 20U of the conductive via 20 to trim the upper portion 20U. According to the embodiment of the present invention, after the second etching process is performed on the upper portion 20U of the conductive via 20, the upper portion 20U has a rounded top surface S4. According to an embodiment of the present invention, the thickness of the lower portion 20L of the conductive via 20 may be greater than the thickness of the upper portion 20U.

Figure 4:
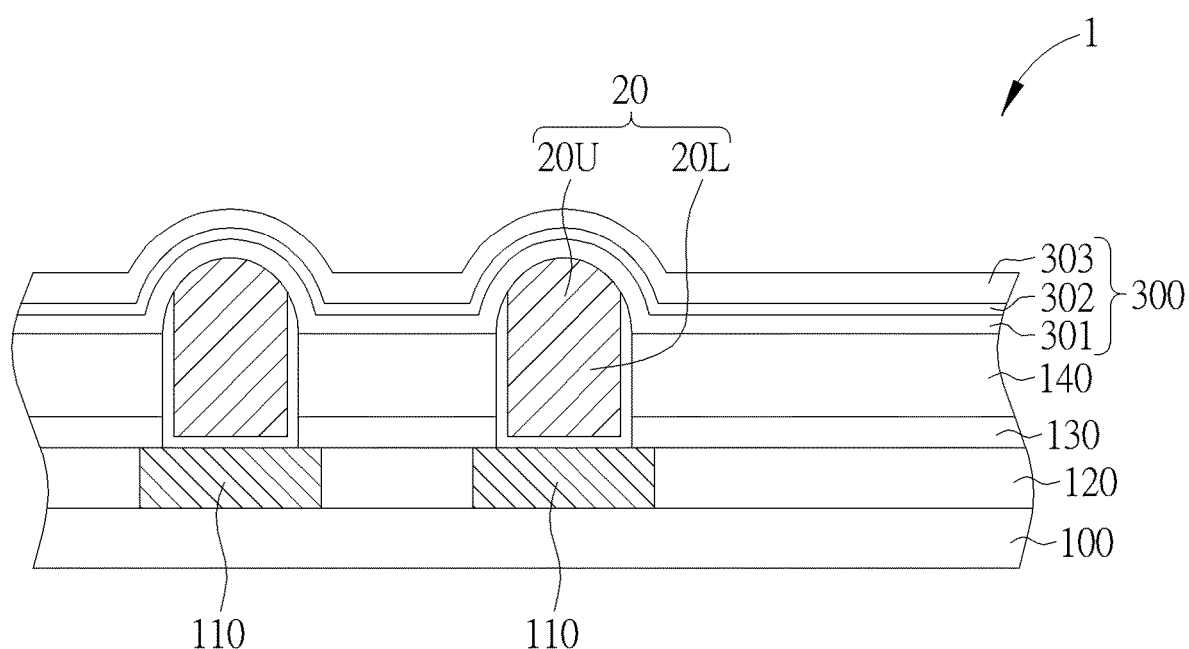

As shown in FIG. 4, next, a lower electrode layer 301, a magnetic tunnel junction stack 302, and an upper electrode layer 303 are sequentially deposited on the top surface S3 of the interlayer dielectric layer 140 and the upper portion 20U of the conductive via 20. The lower electrode layer 301, the magnetic tunnel junction stack 302 and the upper electrode layer 303 constitute a stack structure 300. According to an embodiment of the present invention, the lower electrode layer 301 may be, for example, tantalum nitride, and the upper electrode layer 303 may be, for example, titanium nitride, but is not limited thereto. According to the embodiment of the present invention, the magnetic tunnel junction stack 302 may include a reference layer, a channel layer, and a free layer, but is not limited thereto. The reference layer and the free layer may include a magnetic material, and the channel layer may include an insulating material, but it is not limited thereto.

Figure 5:
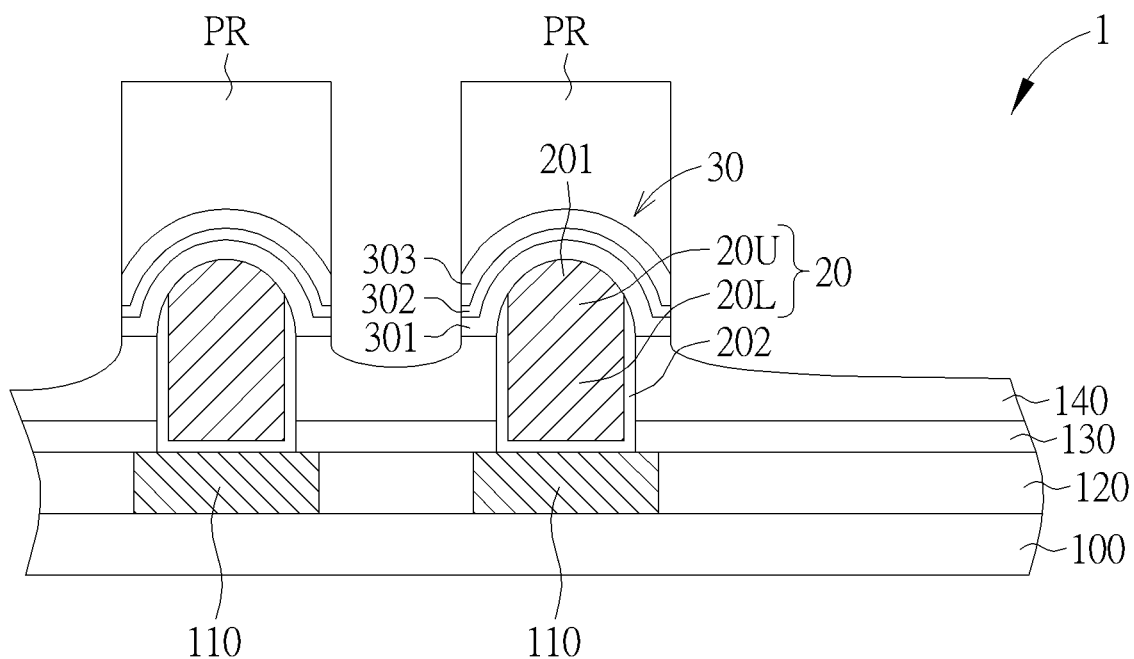

As shown in FIG. 5, next, a photolithography process is performed to form a photoresist pattern PR on the conductive via 20. An etching process, for example, an anisotropic dry etching process, is then performed to etch the stacked structure 300 not covered by the photoresist pattern PR, thereby forming the storage structure 30 that covers the upper portion 20U of the conductive via 20 in a conformal manner. The subsequent steps may include deposition of a low dielectric constant material layer and a subsequent metallization process, which is a well-known technique and will not be described in detail.

Figure 6:
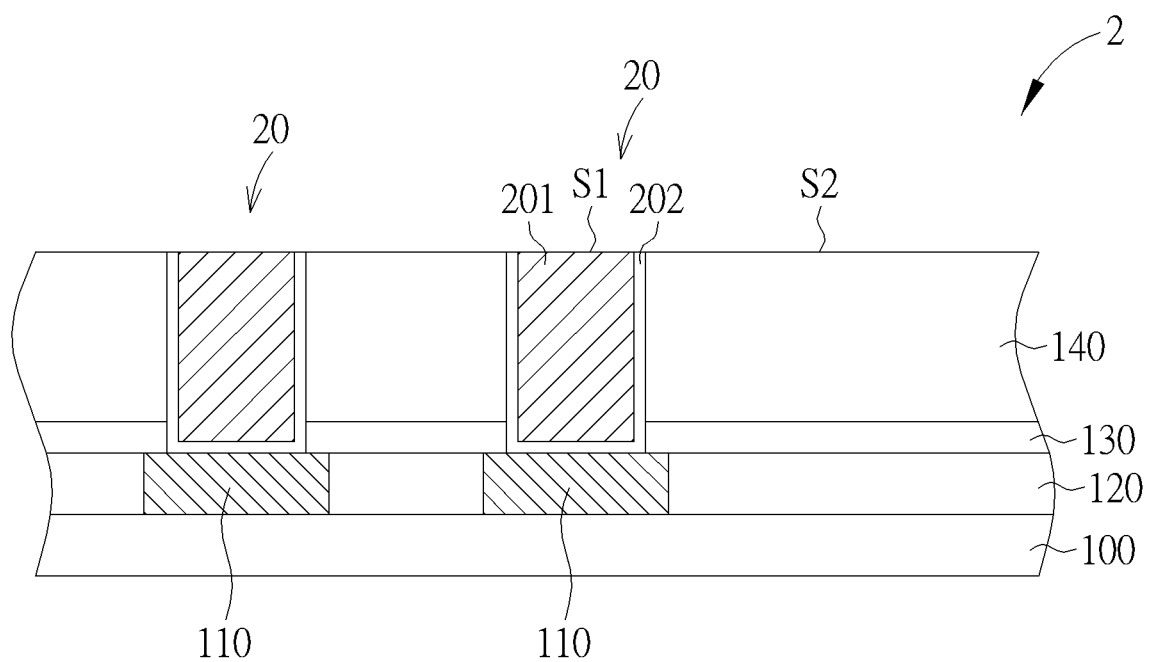
FIG. 6 to FIG. 10 are schematic diagrams illustrating a method of forming a semiconductor memory device according to another embodiment of the present invention.

FIG. 6 to FIG. 10 are schematic diagrams illustrating a method of forming a semiconductor memory device 2 according to another embodiment of the present invention. As shown in FIG. 6, likewise, a substrate 100 is provided, for example, a silicon substrate, on which a conductor region 110 is formed. For example, the conductor region 110 may be a copper metal layer disposed in a dielectric layer 120, but is not limited thereto. According to an embodiment of the present invention, the dielectric layer 120 may be a low dielectric constant material layer, for example, the dielectric constant may be less than 2.5, but is not limited thereto. An inter-dielectric layer 140 is formed on the substrate 100. According to an embodiment of the present invention, the interlayer dielectric layer 140 may be a TEOS-based silicon oxide layer.

According to the embodiment of the present invention, an etch stop layer 130 may be formed between the interlayer dielectric layer 140 and the substrate 100, for example, a nitrogen-doped silicon carbide layer, but it is not limited thereto.

According to the embodiment of the present invention, then, a conductive via 20 is formed in the interlayer dielectric layer 140. According to the embodiment of the present invention, the conductive via 20 is electrically connected to the conductor region 110. At this point, the top surface S1 of the conductive via 20 and the top surface S2 of the interlayer dielectric layer 140 are coplanar. According to the embodiment of the present invention, the conductive via 20 may include a tungsten metal layer 201. In addition, the conductive via 20 may have a barrier layer 202 between the tungsten metal layer 201 and the interlayer dielectric layer 140, such as titanium nitride, but is not limited thereto.

Figure 7:
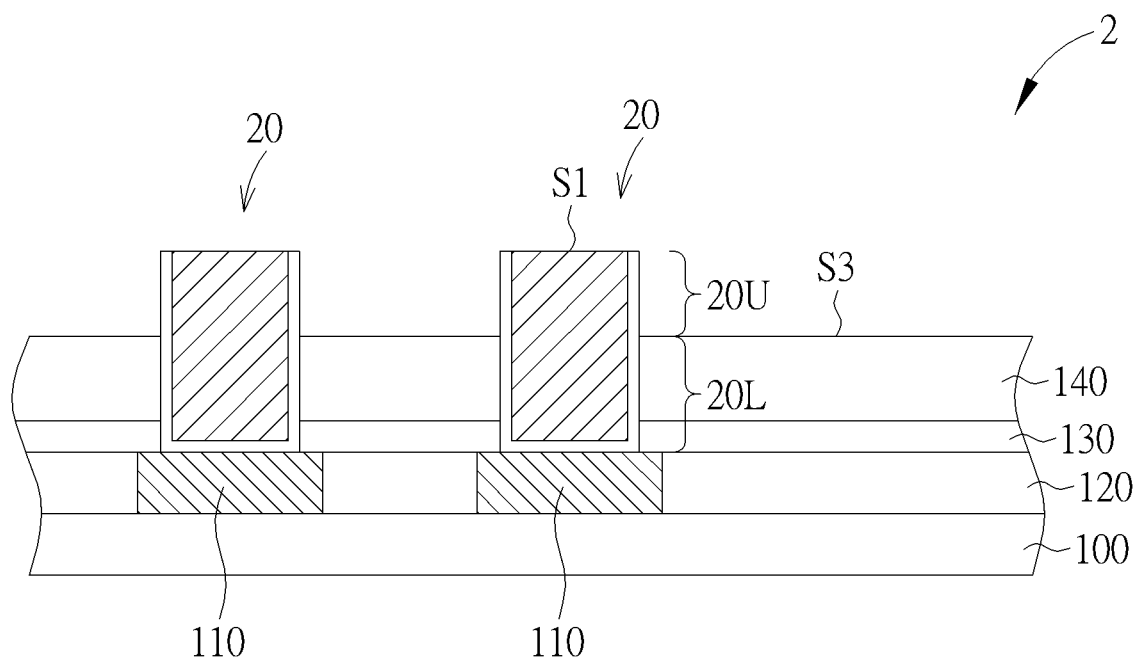

As shown in FIG. 7, then, a first etching process is performed on the interlayer dielectric layer 140, such as a dry etching process, to remove a part of the interlayer dielectric layer 140, so that an upper portion 20U of the conductive via 20 protrudes from the top surface S3 of the interlayer dielectric layer 140 and the lower portion 20L of the conductive via 20 is still embedded in the interlayer dielectric layer 140.

Figure 8:
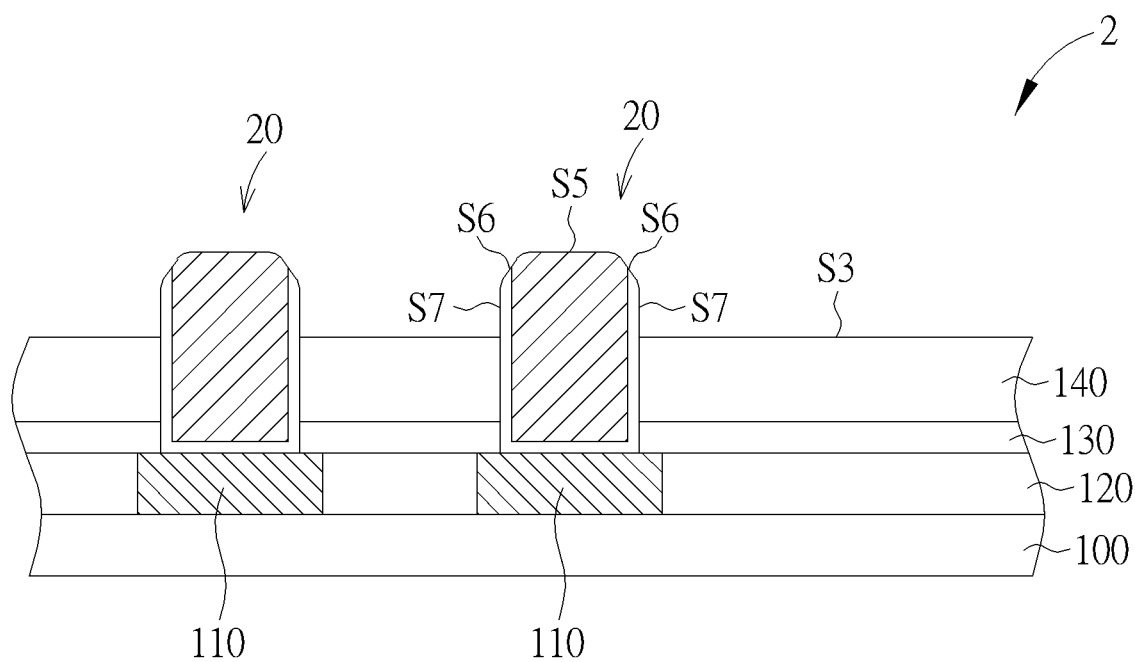

As shown in FIG. 8, next, a second etching process, such as a dry etching process, is performed on the upper portion 20U of the conductive via 20 to trim the upper portion 20U. According to the embodiment of the present invention, after the second etching process is performed on the upper portion 20U of the conductive via 20, the upper portion 20U has a flat top surface S5 and a round edge surface S6 between a sidewall surface S7 and the flat top surface S5. According to an embodiment of the present invention, the thickness of the lower portion 20L of the conductive via 20 may be greater than the thickness of the upper portion 20U.

Figure 9:
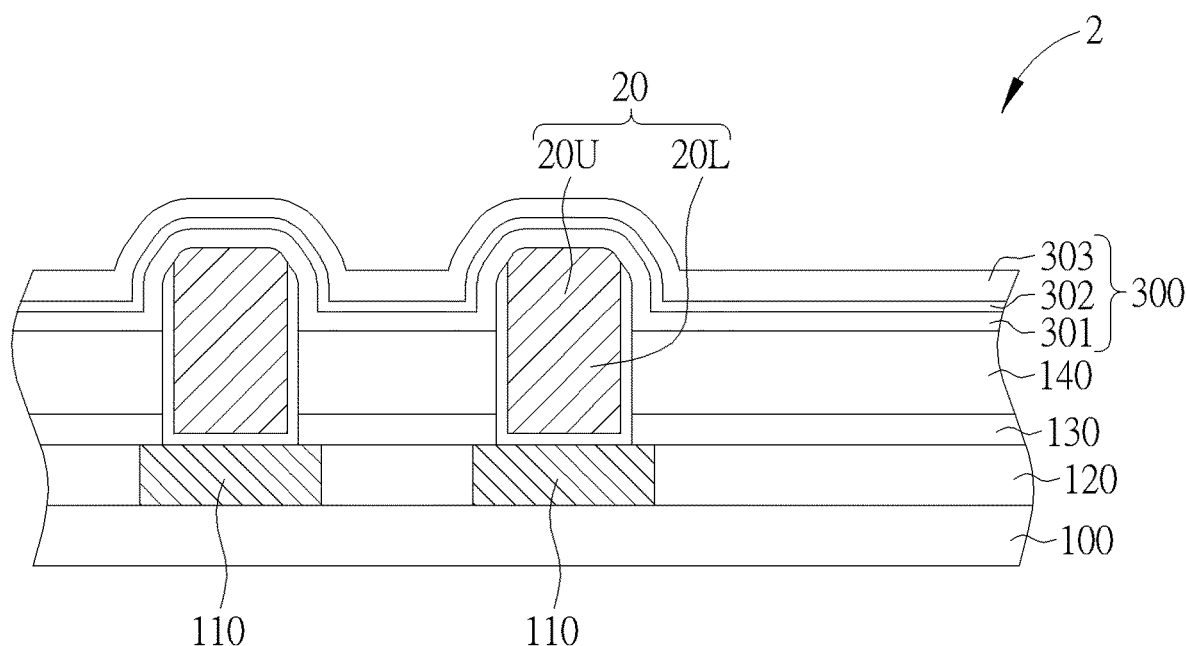

As shown in FIG. 9, next, a lower electrode layer 301, a magnetic tunnel junction stack 302, and an upper electrode layer 303 are sequentially deposited on the top surface S3 of the interlayer dielectric layer 140 and the upper portion 20U of the conductive via 20. The lower electrode layer 301, the magnetic tunnel junction stack 302 and the upper electrode layer 303 constitute a stack structure 300. According to an embodiment of the present invention, the lower electrode layer 301 may be, for example, tantalum nitride, and the upper electrode layer 303 may be, for example, titanium nitride, but is not limited thereto. According to the embodiment of the present invention, the magnetic tunnel junction stack 302 may include a reference layer, a channel layer, and a free layer, but is not limited thereto. The reference layer and the free layer may include a magnetic material, and the channel layer may include an insulating material, but it is not limited thereto.

Figure 10:
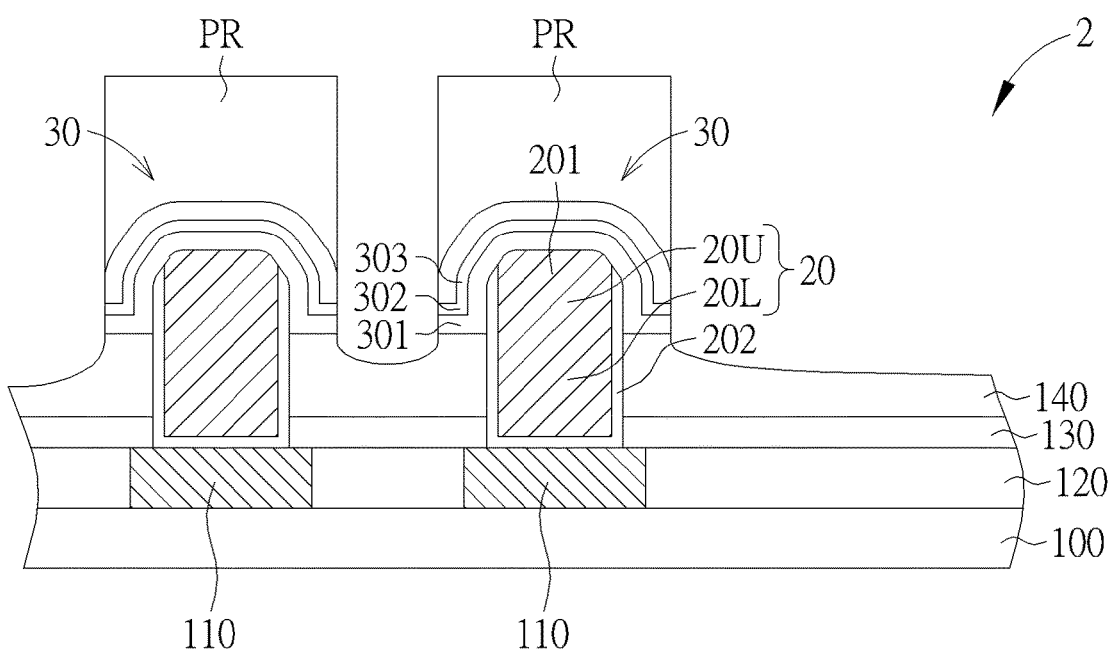

As shown in FIG. 10, next, a lithography process is performed to form a photoresist pattern PR on the conductive via 20, and then an etching process, for example, an anisotropic dry etching process, is performed to etch the stacked structure 300 not covered by the photoresist pattern PR., thereby forming the storage structure 30 that covers the upper portion 20U of the conductive via 20 in a conformal manner. The subsequent steps may include deposition of a low dielectric constant material layer and a subsequent metallization process, which is a well-known technique and will not be described in detail.

The present invention trims the upper portion 20U of the conductive via 20 through the second etching, so that the upper portion 20U has a rounded top surface S4 (FIG. 3) or a flat top surface S5 and a round edge surface S6 between the flat top surface S5 and the sidewall surfaces S7 of the upper portion 20U (FIG. 8), and the subsequently formed storage structure 30 conformally covers the upper portion 20U of the conductive via 20. By providing such configuration, an overlap area between the magnetic tunnel junction stack 302 and the conductive via 20 can be increased, thereby increasing the tunneling magnetoresistance (TMR).

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming a semiconductor memory device, comprising:
   providing a substrate comprising a conductor region thereon;
   forming an interlayer dielectric layer on the substrate;
   forming a conductive via in the interlayer dielectric layer, wherein the conductive via is electrically connected to the conductor region;
   subjecting the interlayer dielectric layer to a first etching process, thereby forming an upper portion of the conductive via protruding from a top surface of the interlayer dielectric layer and a lower portion of the conductive via embedded in the interlayer dielectric layer;
   subjecting the upper portion of the conductive via to a second etching process to trim the upper portion, wherein the upper portion has a flat top surface and a rounded edge surface extending between the flat top surface and a sidewall surface of the upper portion, after subjecting the upper portion of the conductive via to the second etching process; and
   forming a storage structure conformally covering the upper portion of the conductive via.

2. The method according to claim 1, wherein a thickness of the lower portion is greater than that of the upper portion.

3. The method according to claim 1, wherein the interlayer dielectric layer is a tetraethoxysilane (TEOS)-based silicon oxide layer.

4. The method according to claim 1 further comprising:
   forming an etch stop layer between the interlayer dielectric layer and the substrate.

5. The method according to claim 1, wherein the upper portion has a rounded top surface, after subjecting the upper portion of the conductive via to the second etching process.

* * * * *